(12) United States Patent
Hsieh et al.

(10) Patent No.: US 9,360,767 B2
(45) Date of Patent: *Jun. 7, 2016

(54) METHOD AND APPARATUS FOR MAINTAINING DEPTH OF FOCUS

(71) Applicant: Taiwan Semiconductor Manufacturing Company, Ltd., Hsin-Chu (TW)

(72) Inventors: Chang-Tsun Hsieh, Kaoshiung Hsien (TW); Chih-Ming Ke, Hsinchu (TW); Fu-Jye Liang, Zhubel (TW); Li-Jui Chen, Hsinchu (TW); Tzung-Chi Fu, Miaoli (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/682,436

(22) Filed: Apr. 9, 2015

(65) Prior Publication Data
US 2015/0220006 A1    Aug. 6, 2015

Related U.S. Application Data

(63) Continuation of application No. 13/964,931, filed on Aug. 12, 2013, now Pat. No. 9,025,130, which is a continuation of application No. 12/772,647, filed on May 3, 2010, now Pat. No. 8,520,189.

(51) Int. Cl.
| | |
|---|---|
| *G03B 27/32* | (2006.01) |
| *G03B 27/52* | (2006.01) |
| *G03B 27/54* | (2006.01) |
| *G03B 27/74* | (2006.01) |
| *G03F 7/20* | (2006.01) |
| *G02B 7/28* | (2006.01) |
| *G03F 9/00* | (2006.01) |

(52) U.S. Cl.
CPC ............. *G03F 7/70616* (2013.01); *G02B 7/28* (2013.01); *G03F 7/70575* (2013.01); *G03F 7/70641* (2013.01); *G03F 9/70* (2013.01); *G03F 9/7026* (2013.01)

(58) Field of Classification Search
CPC ... G02B 7/28; G03F 7/70333; G03F 7/70575; G03F 7/706; G03F 7/70641; G03F 9/70; G03F 9/7026
USPC ........... 250/201.2–201.5, 226, 492.2; 355/53, 355/55, 67–68, 72, 77; 356/326, 624
See application file for complete search history.

(56) References Cited

U.S. PATENT DOCUMENTS 4,952,945 A    8/1990   Hikima
(Continued)

*Primary Examiner* — Colin Kreutzer
(74) *Attorney, Agent, or Firm* — Haynes and Boone, LLP

(57) ABSTRACT

A method includes directing a beam of radiation along an optical axis toward a workpiece support, measuring a spectrum of the beam at a first time to obtain a first profile, measuring the spectrum of the beam at a second time to obtain a second profile, determining a spectral difference between the two profiles, and adjusting a position of the workpiece support along the optical axis based on the difference. A different aspect involves an apparatus having a workpiece support, beam directing structure that directs a beam of radiation along an optical axis toward the workpiece support, spectrum measuring structure that measures a spectrum of the beam at first and second times to obtain respective first and second profiles, processing structure that determines a difference between the two profiles, and support adjusting structure that adjusts a position of the workpiece support along the optical axis based on the difference.

20 Claims, 5 Drawing Sheets

(56) References Cited

U.S. PATENT DOCUMENTS

| | | |
|---|---|---|
| 6,252,650 B1 | 6/2001 | Nakamura |
| 2002/0097758 A1 | 7/2002 | Ota et al. |
| 2002/0127497 A1 | 9/2002 | Brown et al. |
| 2002/0131030 A1 | 9/2002 | Ouchi |
| 2002/0131032 A1 | 9/2002 | Tsuji et al. |
| 2006/0215134 A1 | 9/2006 | Buurman et al. |
| 2006/0227310 A1 | 10/2006 | Buurman et al. |
| 2009/0316256 A1 | 12/2009 | Epple et al. |

METHOD AND APPARATUS FOR MAINTAINING DEPTH OF FOCUS

CROSS-REFERENCE

This application is a continuation of U.S. patent application Ser. No. 13/964,931, filed on Aug. 12, 2013, which is a continuation of U.S. Pat. No. 8,520,189, filed on May 3, 2010, the entirety of which is hereby incorporated by reference.

BACKGROUND

The semiconductor integrated circuit (IC) industry has experienced rapid growth. Technological advances in IC materials and design have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of integrated circuit evolution, there has been an increase in functional density (the number of interconnected devices per chip area) and a decrease in geometric size (the smallest component or line that can be created using a fabrication process). This scaling-down process generally provides benefits by increasing production efficiency and lowering associated costs.

But scaling down presents challenges as well. For instance, as geometric size and critical dimension (CD) have decreased, it has become more difficult to obtain optimal photolithography results. Lithography tools have generally kept up with the scaling down trend by moving to light sources in the deep ultraviolet spectrum, but problems arise when smaller wavelength light is used to expose current photoresist materials. For example, when a lithography tool's depth of focus is smaller than the thickness of the layer of photoresist to be exposed, only a portion of the layer is actually exposed. Non-uniform exposure of a layer of photoresist may lead to non-uniform etch patterns and etch bias, ultimately degrading device performance.

Techniques to compensate for inadequate depth of focus have been devised and are generally adequate for their intended purpose, but they are not entirely satisfactory. For example, some suffer from problems such as unacceptable critical dimension variation (also known as "tiger skin").

SUMMARY

According to one of the broader forms of the invention, a method includes directing a beam of radiation along an optical axis toward a workpiece support, measuring a spectrum of the beam at a first time to obtain a first spectral profile, measuring the spectrum of the beam at a second time subsequent to the first time to obtain a second spectral profile, determining a spectral difference between the first spectral profile and the second spectral profile, and adjusting a position of the workpiece support along the optical axis based on the spectral difference.

According to another of the broader forms of the invention, an apparatus includes a workpiece support, beam directing structure that directs a beam of radiation along an optical axis toward the workpiece support, spectrum measuring structure that measures a spectrum of the beam at first and second times to obtain respective first and second spectral profiles, the second time being after the first time, processing structure that determines a spectral difference between the first spectral profile and the second spectral profile, and support adjusting structure that adjusts a position of the workpiece support along the optical axis based on the spectral difference.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

DETAILED DESCRIPTION

Figure 1:
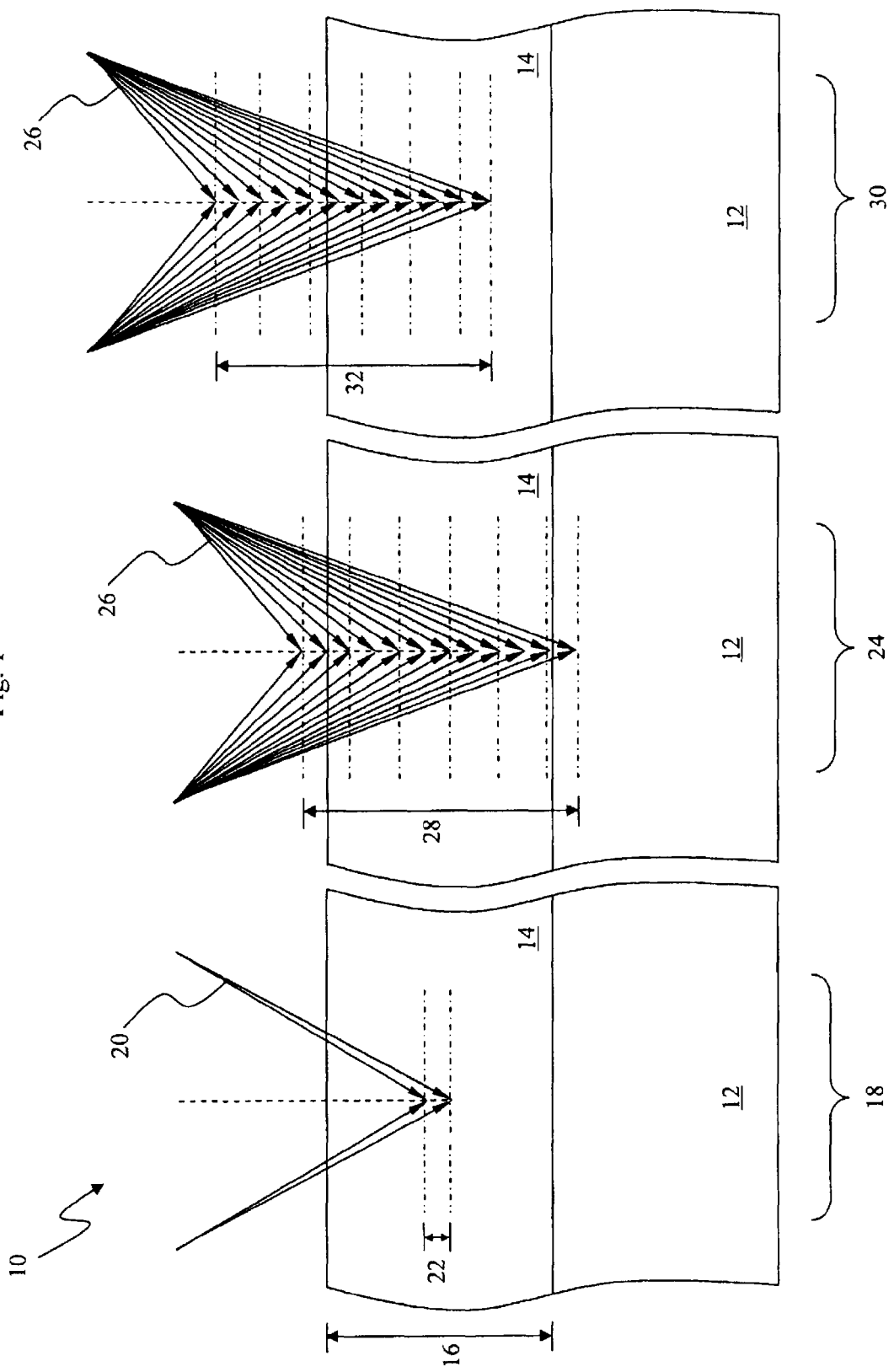
FIG. 1 is a diagrammatic sectional side view of a semiconductor wafer and shows three photolithography exposures.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagrammatic sectional side view of a semiconductor wafer 10 showing three different photolithography exposures. For the sake of simplicity, wafer 10 is depicted with only a substrate 12 and a photoresist layer 14, but wafer 10 may include more layers such as an etch stop layer and a dielectric layer. Photoresist layer 14 has a thickness 16 and facilitates the transfer of a reticle pattern to wafer 10.

During an exposure 18, a narrowband beam of radiation 20 emitted from a not-illustrated lithography light source exposes a portion of the photoresist layer 14 of wafer 10. Beam 20 is a spectrum of light in the deep ultraviolet (DUV) range with a spectral width of approximately 0.3 picometers (pm) and a depth of focus 22. As evident from FIG. 1, depth of focus 22 is substantially smaller than thickness 16 of photoresist layer 14. Consequently, only a portion of the layer 14 is properly exposed. That is, the layer 14 does not receive uniform exposure from top to bottom. Non-uniform exposure of the photoresist layer 14 may lead to non-uniform photoresist development, etch bias, and ultimately, degradation in device performance.

During a different exposure 24, a broadband beam of radiation 26 emitted by a different not-illustrated lithography light source exposes the photoresist layer 14. Beam 26 is also a spectrum of light in the DUV range but has a spectral width of approximately 1.2 pm. A larger spectral width means beam 26 contains a plurality of wavelengths, and each has a different focus plane. In particular, beam 26 passes through not-illustrated optics that provide intentional chromatic aberration in order to increase the depth of focus. Beam 26 has an effective depth of focus 28 that is much larger than the depth of focus 22 of narrowband beam 20, and is also larger than thickness 16 of the photoresist layer 14. Thus, during exposure 24, the entire thickness 16 of photoresist layer 14 is exposed, eliminating the possibility of non-uniformity that can lead to etch bias during subsequent development of layer 14.

Light sources that emit broadband beams may exhibit spectral shift over the course of multiple exposures, even if spectral width is maintained. This phenomenon is depicted by an exposure 30 after exposure 24. During exposure 30, the same broadband beam 26 exposes the photoresist layer 14. Beam 26 has a depth of focus 32 that is approximately the same size as depth of focus 28. However, depth of focus 32 is offset vertically with respect to depth of focus 28 such that it does not align with photoresist layer 14. Consequently, the entire thickness 16 of layer 14 is not uniformly exposed, leading to a possibility of etch bias after development. Etch bias may ultimately lead to unwanted variation in critical dimension (CD) at different pitches on wafer 10.

The specific values presented in association FIG. 1 may be larger or smaller in practice. Further, spectral shift in broadband beams of radiation may also produce changes in exposure intensity or the size of the depth of focus.

Figure 2:
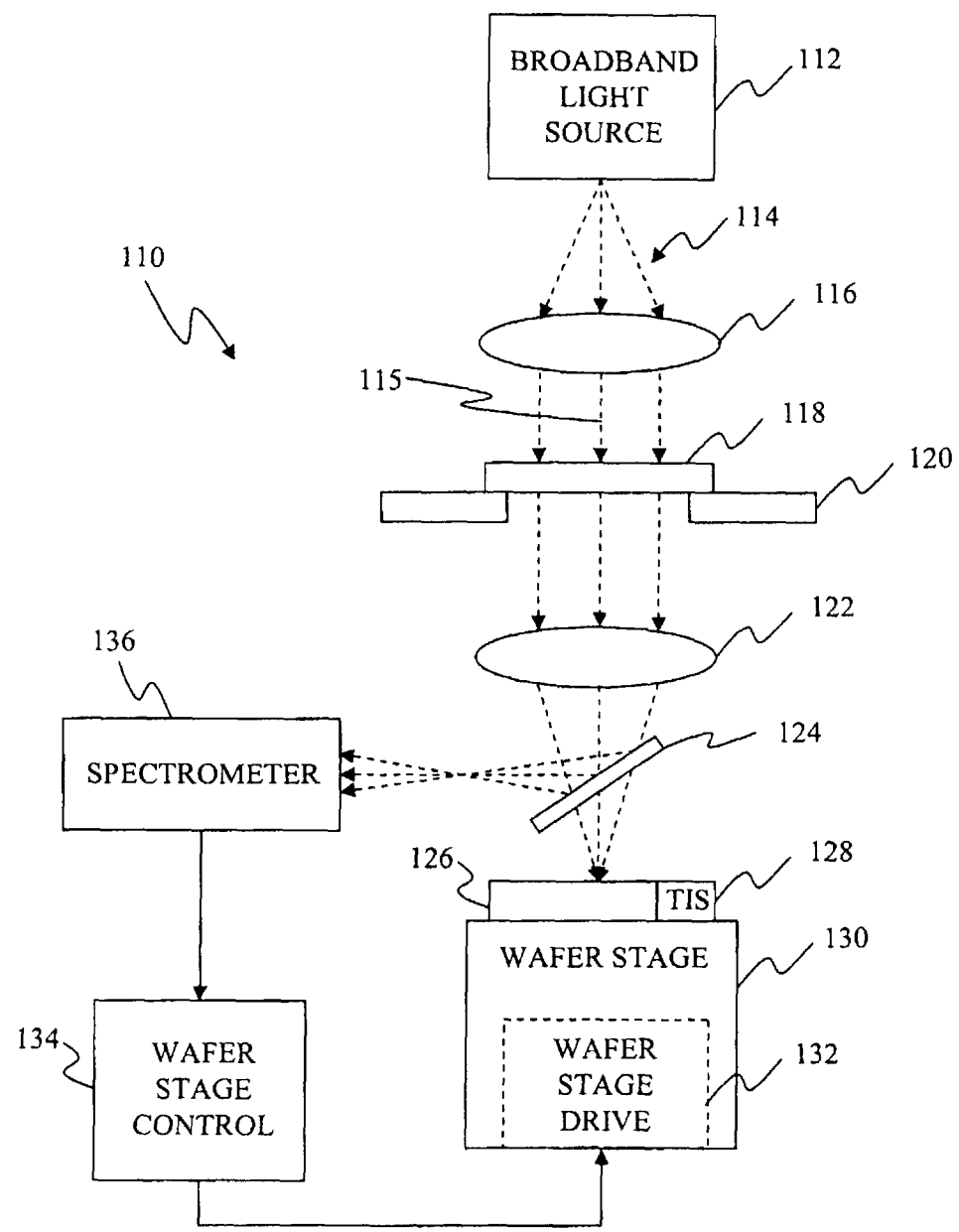
FIG. 2 is a diagrammatic side view of an apparatus that is a lithography system.

FIG. 2 is a diagrammatic side view of an apparatus that is a lithography system 110 for the exposure of semiconductor wafers. The lithography system 110 includes a broadband light source 112 that produces a beam of radiation 114 similar to the broadband beam of radiation 26 in FIG. 1. The light source 112 is a excimer laser capable of producing light in the DUV range. Alternatively, the light source 112 may produce a beam of radiation in other ranges such as vacuum ultraviolet (VUV) or extreme ultraviolet (EUV). The beam 114 includes a broadband range of wavelengths in the DUV spectrum and has a spectral width of approximately 1.2 pm. However, the beam's spectral width may alternatively be larger or smaller depending on the exposure application. Here, spectral width is defined as the spectral distance between the two wavelengths that encompass ninety-five percent of spectral energy of the beam. This method of measuring spectral width is commonly known as E95.

The beam of radiation 114 is directed along an optical axis 115 through the lithography system 110 by optics that include a standard condenser lens 116. The condenser lens 116 is configured to collimate and direct the beam 114 along the optical axis 115 toward a reticle 118. The reticle 118 is held by a reticle stage 120 at a location along the optical axis 115 and includes a pattern image to be transferred along the optical axis. The reticle stage 120 is configured to adjust the position of the reticle 118 in directions transverse to the optical axis 115 for stepping between exposure fields on a wafer and for aligning the reticle 118 with the optical axis. After passing through the reticle 118, the beam 114 passes through a standard projection lens 122 that is part of the optics. The projection lens 122 is configured to focus the pattern image carried by the beam 114 along the optical axis. Both condenser lens 116 and projection lens 122 are exemplary and alternatively may each be a lens group. Once through the projection lens 122, a small portion of beam 114 is reflected away from the optical axis 115 by a beam splitter 124 that is disposed along the optical axis. The beam splitter 124 has a reflection coefficient of less than 5% so as to divert only an insignificant portion of the beam 114 away from the optical axis. Alternatively, the beam splitter 124 may have a larger reflection coefficient or may intercept the beam 114 at a different location along the optical axis 115, for example between the condenser lens 116 and the reticle 118.

A semiconductor wafer 126 is disposed along the optical axis 115 below the beam splitter 124. The wafer 126 includes a plurality of exposure fields that may be successively aligned with the reticle 118 so that the beam 114 individually exposes each exposure field with the pattern contained on the reticle. A transmission image sensor (TIS) 128 is disposed immediately next to the wafer 126. The TIS 128 is configured to detect light from the broadband light source 112 and gather alignment data for alignment of the wafer 126. Alternatively, the TIS 128 may gather alignment data based upon light from an independent alignment light source.

A wafer stage 130 supports the wafer 126 and is configured to movably position it for proper alignment along the optical axis. TIS 128 is also disposed on the wafer stage 130, immediately adjacent to the wafer 126. The wafer stage 130 can be adjusted in three orthogonal directions, x, y, and z, where z is parallel to the optical axis 115, and x and y lie in a plane substantially perpendicular to the optical axis 115. A wafer stage drive 132 is included in the wafer stage 130 and contains hardware to make the adjustments to the position of the wafer stage 130. A wafer stage control 134 is electronically coupled to the wafer stage drive 132 and is configured to transmit control data for controlling the position of the wafer stage 130 and thus the wafer 126. The wafer stage control 134 may also be configured to electronically receive wafer alignment data from TIS 128 to initially align wafer stage 130 before exposure of wafer 126. The wafer stage control 134 includes a not-illustrated digital processor, and a memory storing a computer program executed by the processor, but could alternatively be implemented in some other manner.

Lithography system 110 includes a spectrometer 136 that receives the portion of the beam 114 reflected by the beam splitter 124. The spectrometer 136 measures the spectrum of the beam 114 and electronically transmits spectrum data to the wafer stage control 134. The wafer stage control 134 is configured to receive and process spectrum data from the spectrometer 136. Alternatively, the spectrometer or some other processing structure may process the raw spectrum data instead of the wafer stage control 124.

As noted in the discussion of FIG. 1, broadband light sources such as broadband light source 112 are generally advantageous for improved depth of focus, but they may exhibit spectral shift over the course of multiple exposures (such as that from exposure 24 to exposure 28 in FIG. 1), even if spectral width (as measured by E95) is maintained. Spectral shift may cause a shift in depth of focus at the point of wafer exposure which, if not compensated for, may result in uneven photoresist exposure in subsequent exposures. Uneven exposure may in turn lead to unwanted variation in critical dimension (CD) at different pitches. In operation, the lithography system 110 dynamically compensates for spectral shift in the beam 114 to improve wafer exposure results. More specifically, to compensate for this shift and maintain through-pitch CD uniformity, lithography system 110 uses inline metrology to measure the spectrum of beam 114 during wafer exposure, and then may adjust the position of wafer stage 130 based on the measured spectrum data.

In more detail, broadband light source 112 outputs the beam 114 along the optical axis 115 through the condenser lens 116, the reticle 118, the projection lens 122, and the beam splitter 124, and onto the wafer 126. The light source 112 periodically emits the beam 114 in a series of exposures, as needed to expose all exposure fields on wafer 114 and subsequent wafers in a production run. During each exposure, a portion of the beam 114 is diverted by the beam splitter 124 to the spectrometer 136 before beam 114 reaches the wafer 126. The spectrometer measures the spectrum of the beam 114 and sends spectrum data to the wafer stage control 134. The wafer stage control 134 analyzes the spectrum output by the light source 112 during the current exposure and compares it to a spectrum output during a past exposure, in a manner described in more detail later. The wafer stage control 134 then determines a spectral shift from the comparison and calculates a distance and direction along the optical axis 115 that the wafer stage 130 needs to be moved to compensate for the spectral shift. Next, based on the result of the calculation, the wafer stage control 134 sends an adjustment signal to the wafer stage drive 132, which in turn moves the wafer stage 130 along the optical axis 115. Adjustment to the wafer stage position occurs after the current exposure is finished and before another exposure occurs. Alternatively, the adjustment may be made after a subsequent exposure and before the next wafer is positioned on the wafer stage 130.

Figure 3:
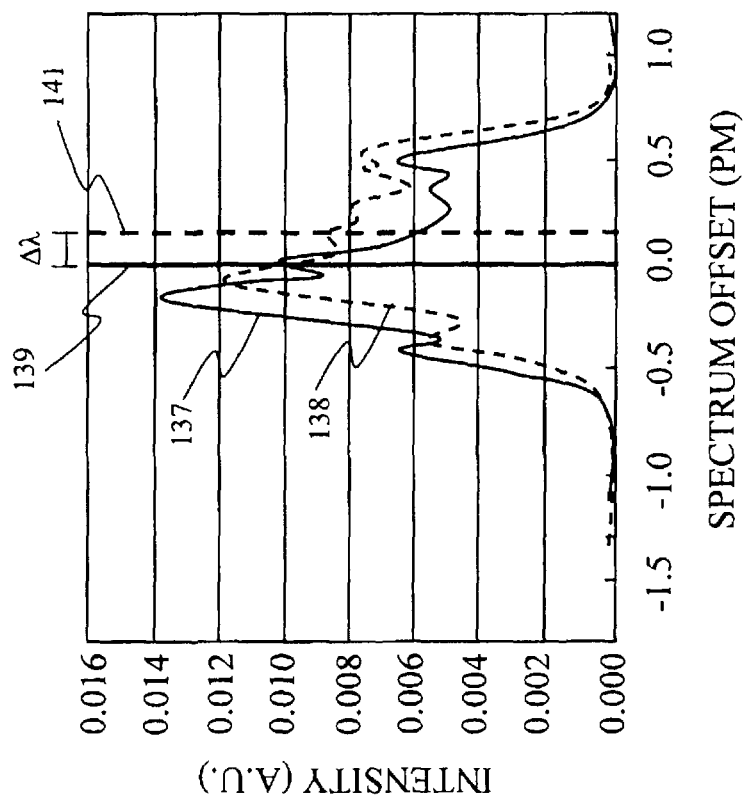
FIG. 3 is a graph depicting spectrum data generated by the lithography system in FIG. 2.

FIG. 3 is a graph depicting two different spectral profiles 137 and 138 of the broadband beam of radiation 114 emitted by lithography tool 110, as measured during two different exposures. The spectral profiles 137 and 138 represent the intensity of each exposure as a function of wavelength. The y-axis of the graph represents wavelength intensity and the x-axis represents wavelength. However, for the sake of clarity, specific wavelength values on the x-axis have been replaced with arbitrary spectrum offset values to aid in measurement of spectral offset.

Spectral profile 137, depicted with a solid line curve, represents the intensity of each wavelength in the beam's spectrum during a first exposure. Likewise, spectral profile 138, depicted with a broken line curve, represents the intensity of each wavelength in the beam's spectrum during a subsequent exposure. For the purposes of clarity, the curves are shown as smooth but in actuality are defined by a plurality of raw data points gathered by inline metrology. Although not explicitly indicated, the spectral widths of the two profiles are equal, where spectral width is the distance in the x-axis direction between symmetrical points on the curve that encompass ninety-five percent of the spectral energy (E95). Further, each spectral profile has an E50 intensity center, 139 or 141, which is defined as the wavelength in the spectral profile where the spectral energy on one side of the wavelength is equal to the spectral energy on the other side of the wavelength. In other words, E50 is the wavelength at 50% integral spectrum energy. The E50 wavelength of spectral profile 137 is represented by a solid vertical line 139, and the E50 wavelength of spectral profile 138 is represented by a broken vertical line 141. It should be noted that the value of zero along the x-axis is arbitrarily set to the value of the E50 wavelength 139 for spectral profile 137.

As evident from the graph, the spectral profiles are offset, which represents a spectral shift in the beam 114 between the first exposure and the subsequent exposure. The amount of the spectral offset ($\Delta\lambda$) is the distance along the x-axis between the E50 wavelength 139 of profile 137 and the E50 wavelength 141 of profile 138. As mentioned above, to compensate for this spectral shift, the wafer stage 130 of the lithography tool 110 is adjusted along the optical axis 115 based on this spectral shift. Specifically, the amount and direction of adjustment along the optical axis 115 is calculated as a function of the spectral offset ($\Delta\lambda$) and a longitudinal aberration (constant C), using the equation: $\Delta z = C^* \Delta\lambda$.

The data represented in the graph in FIG. 3 is a hypothetical example for explanation and illustration purposes only, but is representative of what will actually be generated by the lithography system 110 of FIG. 2.

Figure 4:
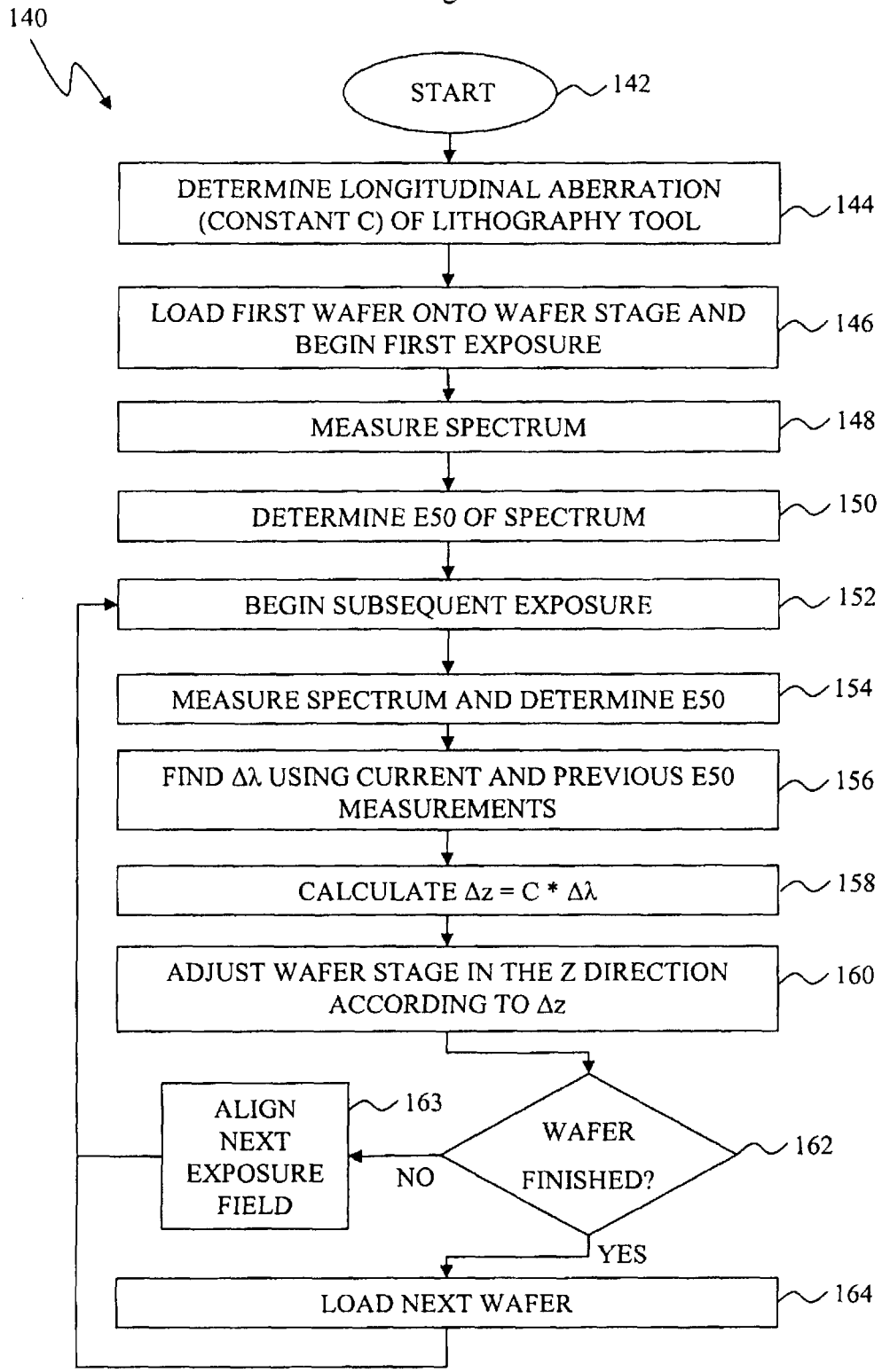
FIG. 4 is high-level flowchart showing a process carried out by the lithography system in FIG. 2.

FIG. 4 is a high-level flowchart showing a process 140 for dynamically adjusting wafer stage 130 of lithography system 110 to compensate for spectral shift during wafer exposure. Process 140 is carried out by the lithography system 110 of FIG. 2 and implements the concepts discussed in association with the graph of FIG. 3. Process 140 begins at block 142, and proceeds to block 144 where the constant C representing longitudinal aberration of the optics of the lithography system 110 is determined. In this regard, every lithography tool has a distinct longitudinal aberration constant, which is the distance along a tool's optical axis from the focus of paraxial rays to the point where rays coming from the outer edges of its lens or reflecting surface intersect this axis. Longitudinal aberration values are typically in the range of 0.2 to 0.5 µm/pm, and remain static for each lithography tool. Constant C may be determined by configuring the light source 112 to output a light spectrum with a pre-determined center wavelength, and by then using the transmission image sensor (TIS) 128 to determine where along the optical axis 115 the beam 114 has its maximum intensity. Alternatively, C may be determined by any other suitable method.

Next, in block 146, a first wafer 126 is loaded onto the wafer stage 130 and the lithography system 110 is properly focused and aligned for exposure with reticle 118. Calibration of the reticle stage 120 and wafer stage 130 in the x, y, and z directions may be performed with TIS 128 or other suitable equipment, in a manner known in the art. Upon completion of appropriate calibration steps, a first exposure of the wafer 126 is initiated.

Process 140 proceeds to block 148, where, during the first exposure, the spectrum of the beam 114 is measured using inline metrology. Specifically, the beam splitter 124, disposed along the optical axis 115, diverts a small portion of the beam 114 to the spectrometer 136. A detailed spectral profile (or curve) is obtained from the raw spectrometer data by plotting measured wavelength intensity against wavelength for each wavelength in the spectrum. This might, for example, be the spectral profile 137 of FIG. 3. Next, in block 150, the intensity center of the spectral profile obtained in block 148 is determined (and is the wavelength at 50% integral spectral energy). In FIG. 3, this is the E50 wavelength 139. The E50 wavelength of the initial spectrum reading is stored and saved for later calculations.

Then, process 140 proceeds to block 152 where the lithography system 110 initiates a subsequent exposure, which is the exposure immediately after the first exposure. Then, in block 154, during the subsequent exposure, the beam splitter 124 again deflects a portion of the beam 114 to the spectrometer 136 to measure the spectrum a second time. A second spectral profile is obtained from the second spectrum measurement and the E50 wavelength for the second spectral profile is determined and is stored. In FIG. 3, this would be the spectral profile 138 and E50 wavelength 141.

Process 140 proceeds to block 156 where a spectral shift of the beam, if any, is determined. The spectral shift is determined by measuring the offset between the intensity center of the first spectral profile (139 and 137 in FIG. 3) and the intensity center of the second spectral profile (141 and 138 in FIG. 3). Specifically, the difference between the first E50 wavelength and the second E50 wavelength is calculated to determine an E50 offset ($\Delta\lambda$). E50 offsets may be in the range of 0.2 pm, but larger or smaller offsets may occur depending on various factors, including the number of exposures between spectrum measurements.

Next, in block 158, the amount of wafer stage adjustment ($\Delta z$) needed to compensate for spectral shift is determined. Specifically, the amount and direction of adjustment along the optical axis 115 is calculated as a function of E50 offset ($\Delta\lambda$) and longitudinal aberration (C), using the equation: $\Delta z = C^* \Delta\lambda$. Then, in block 160, the wafer stage 130 is adjusted along the optical axis 115 by an amount equal to the $\Delta z$ value calculated at block 158. The adjustment is made after the most recent exposure but before the next exposure is initiated. More generally, the adjustment may be made between any two exposures, for instance, while the lithography tool is aligning the optical axis 115 with another exposure field on the wafer.

Then, in block 162, process 140 continues on to either block 163 or block 164 depending on whether processing of the current wafer is finished. If every exposure field on the wafer 114 has not been exposed, then process 140 proceeds to block 163 where the wafer stage 130 moves the wafer 126 to align the next unexposed field with the optical axis 115. If it is instead determined at decision block 162 that every exposure field on the wafer 114 has been exposed, then process 140 proceeds to block 164, where the next wafer is loaded onto the wafer stage and aligned. From each of blocks 163 and 164, process 140 returns to block 152 and another exposure is initiated. From there, process 140 repeats blocks 154 through 162 to determine a new E50 offset, and to again adjust the wafer stage 130 along the optical axis 115 to compensate for any additional spectral shift. The iterative feedback loop of blocks 152 through 164 continues until processing of every wafer in the production run has been completed. As process 140 repeatedly proceeds through this loop, the wafer stage 130 is dynamically adjusted along the optical axis 115 to compensate for any measured spectral shift. Thus, depth of focus is maintained through successive exposures and through-pitch critical dimension is substantially uniform.

The lithography system 110 may alternatively compensate for spectral shift with a combination of inline metrology data and alignment data from TIS 128. For example, during an exposure, TIS alignment data indicating the intensity of the beam 114 at points along the z-axis may be transmitted to the wafer stage control 134 or other processing structure for analysis. The peak intensity of the beam along the z-axis may be calculated and compared to a previous TIS peak intensity measurement to produce a TIS offset value. This TIS offset value may be used in conjunction with the spectral offset value to adjust wafer stage 130. For example, the amount of adjustment needed to wafer stage 130 along the z-axis may be calculated by averaging the TIS offset value and the Δz value corresponding to the spectral offset value (as calculated in block 158 of FIG. 4). Other equations that are a function of both TIS offset and spectral offset may alternatively be utilized. Further, the lithography system 110 may additionally perform other adjustments to its various components upon detection of spectral shift in beam 114.

Figure 5:
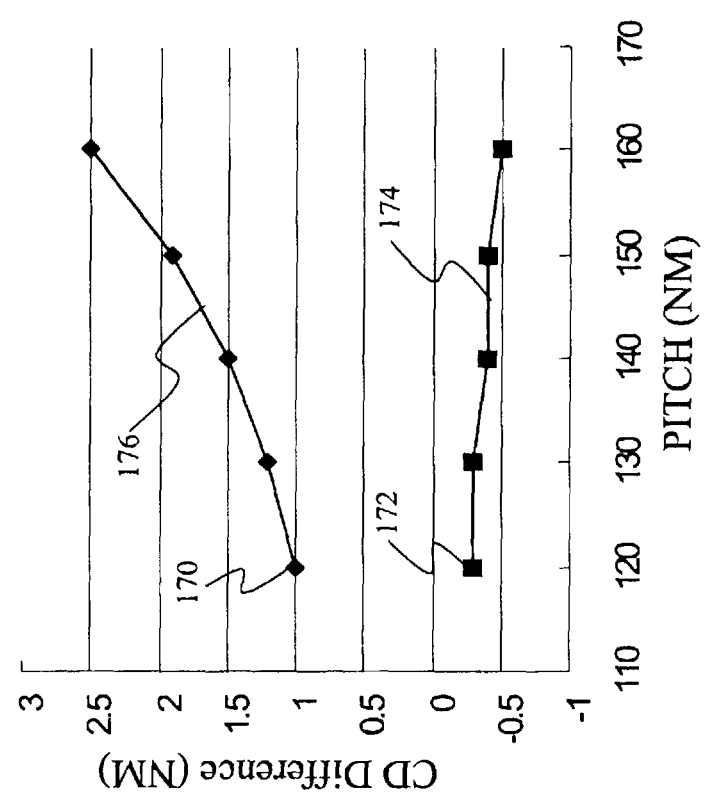
FIG. 5 is a graph depicting critical dimension data for the lithography system in FIG. 2.

FIG. 5 is a graph depicting the difference in critical dimension (CD) deviation at different pitch values between two alternative broadband exposures. Each exposure was initiated after a common prior exposure. However, before one of the alternative exposures, the position of wafer stage 130 was adjusted along the optical axis to compensate for spectral shift, whereas before the other alternative exposure, no such adjustment was made. In the graph, each data point represents the difference in CD at a specific pitch between the prior exposure and one alternative subsequent exposure. For example, a data point 170 indicates that, at a pitch of 120 nm, the CD of the second exposure (with no adjustment to the wafer stage position) was approximately 1 nm greater than the CD of the common prior exposure. And a data point 172 indicates that, at a pitch of 120 nm, the CD of an alternate second exposure (with adjustment to the wafer stage position) was approximately 0.3 nm less than the CD of the prior exposure. As such, a curve 174 (defined by square data points) represents data collected after positional adjustment of wafer stage 130 along the optical axis 115 in order to compensate for spectral shift. That is, an iteration of process 140 described in conjunction with FIG. 3 was carried out between two exposures. And a curve 176 (defined by the diamond-shaped data points) represents data collected during an alternative subsequent exposure, where no positional adjustment of the wafer stage is made between the successive exposures.

As evident from the graph, when a wafer is exposed to a broadband beam without any compensation for spectral shift, the critical dimension variation from a previous exposure may increase substantially at larger pitches. But when wafer stage adjustment is made before a subsequent exposure, critical dimension variation from a previous exposure may be less than or equal to 0.5 nm, even as pitch increases. The data in FIG. 5 is representative of the improvement in critical dimension uniformity achieved by the lithography system 110 of FIG. 2 and the process 140 of FIG. 4. However, data collected in practice may vary somewhat from the data shown in the graph.

The foregoing discussion outlines one embodiment in detail so that those skilled in the art may better understand aspects of the present disclosure. Specifically, the lithography system 110 and process 140 as described in conjunction with FIGS. 2 and 4 are solely to facilitate the understanding of the present disclosure and not to limit it. Those skilled in the art should appreciate that they may readily use the present disclosure as a basis for designing or modifying other processes and structures for carrying out the same purposes and/or achieving the same advantages of the embodiment introduced herein. Accordingly, structure and procedures disclosed in the above embodiment may be modified or added to, or removed without departing from the spirit and scope of the present disclosure. For example, the disclosure above generally relates to a step-and-scan reduction projection type lithography system, but the lithography system 110 may include a step-and-repeat reduction projection scanner or other type of scanner without departure from the scope of the present disclosure. Additionally, the present disclosure may be applied not only to semiconductor devices but also to image pickup devices, liquid crystal displays, and other applications that benefit from exposure with a broadband light source.

What is claimed is:

1. A method comprising:
    aligning a first exposure field along an optical axis, the first exposure field being supported by a workpiece support;
    directing a first beam of radiation, with optics of a lithography tool, along the optical axis toward the first exposure field, the optics of the lithography tool having a longitudinal aberration;
    measuring a spectrum of the first beam to obtain a first spectral profile and also measuring a first peak intensity of the first beam;
    aligning a second exposure field along the optical axis, the second exposure field being supported by the workpiece support;
    directing a second beam of radiation, with optics of the lithography tool, along the optical axis toward the second exposure field;
    measuring the spectrum of the second beam to obtain a second spectral profile and also measuring a second peak intensity of the second beam;
    calculating a spectral offset between the first and second spectral profiles;
    calculating a peak intensity offset between the first peak intensity and the second peak intensity;
    calculating an adjustment amount based on the spectral offset, the longitudinal aberration, and the peak intensity offset; and adjusting a position of the workpiece support along the optical axis by the adjustment amount.

2. A method according to claim 1, including configuring the first and second beams of radiation to each include a broadband range of wavelengths such that the beams have a spectral width of at least approximately 1.2 picometers.

3. A method according to claim 1, including maintaining a spectral width of the beam that is approximately constant.

4. A method accordingly to claim 1, wherein calculating the spectral offset includes:
determining a first intensity center of the first spectral profile;
determining a second intensity center of the second spectral profile; and
determining the spectral offset between the intensity centers.

5. A method according to claim 4,
wherein the determining the first intensity center includes finding a first wavelength in the first spectral profile such that spectral energy of the first spectral profile is approximately equal on each side of the first wavelength; and
wherein the determining the second intensity center includes finding a second wavelength in the second spectral profile such that spectral energy of the second spectral profile is approximately equal on each side of the second wavelength.

6. A method according to claim 1, including:
after the adjusting, aligning a third exposure field along the optical axis, the third exposure field being supported by the workpiece support;
directing a third beam of radiation, with optics of the lithography tool, along the optical axis toward the third exposure field;
measuring the spectrum of the third beam to obtain a third spectral profile;
calculating a further spectral offset between the second and third spectral profiles;
calculating a further adjustment amount based on the further spectral offset and the longitudinal aberration; and
adjusting the position of the workpiece support along the optical axis by the further adjustment amount.

7. A method according to claim 1, wherein the measuring the spectrums of the first and second beams is carried out by sampling the first and second beams along the optical axis.

8. A method according to claim 7, wherein the measuring the spectrums of the first and second beams is carried out by a spectrometer.

9. A method according to claim 8, wherein measuring the spectrums of the first and second beams includes diverting portions of the first and second beams to the spectrometer with a beam splitter positioned along the optical axis.

10. A method according to claim 1, wherein the first and second exposure fields are portions of a semiconductor wafer supported by the workpiece support.

11. A method according to claim 10,
wherein measuring the spectrum of the first beam is carried out during a first exposure of the wafer, measuring the spectrum of the second beam is carried out during a second exposure of the wafer after the first exposure, and the adjusting is carried out after the second exposure but before a subsequent exposure.

12. A method comprising:
during a first exposure of a semiconductor wafer supported by a workpiece support:
directing a beam of radiation, with optics of a lithography tool, along an optical axis toward the semiconductor wafer, the optics of the lithography tool having a longitudinal aberration; and
measuring a spectrum of the beam to obtain a first spectral profile and also measuring a first peak intensity of the beam;
during a second exposure subsequent to the first exposure of the semiconductor wafer supported by the workpiece support:
directing the beam of radiation, with the optics of the lithography tool, along the optical axis toward the semiconductor wafer; and
measuring the spectrum of the beam to obtain a second spectral profile and also measuring a second peak intensity of the beam;
determining a first intensity center of the first spectral profile, determining a second intensity center of the second spectral profile, and determining a spectral offset between the intensity centers;
calculating a peak intensity offset between the first peak intensity and the second peak intensity;
calculating an adjustment amount based on the spectral offset, the longitudinal aberration, and the peak intensity offset; and
adjusting a position of the workpiece support along the optical axis by the adjustment amount.

13. A method according to claim 12, wherein the adjusting is carried out after the second exposure but before a subsequent exposure.

14. An apparatus comprising:
a workpiece support supporting a semiconductor wafer having first and second exposure fields;
beam directing structure that directs first and second beams of radiation along an optical axis toward the respective first and second exposure fields, wherein the beam directing structure includes optics that impart a longitudinal aberration to the first and second beams along the optical axis;
spectrum measuring structure that measures spectrums of the first and second beams to obtain respective first and second spectral profiles;
intensity measuring structure that measures peak intensities of the first and second beams to obtain respective first and second peak intensities;
processing structure that calculates a spectral offset between the first spectral profile and the second spectral profile, calculates a peak intensity offset between the first and second peak intensities, and also calculates an adjustment amount based on the spectral offset, the peak intensity offset, and the longitudinal aberration; and
support adjusting structure that adjusts a position of the workpiece support along the optical axis by the adjustment amount.

15. An apparatus according to claim 14, wherein the first and second beams of radiation each include a broadband range of wavelengths such that the first and second beams have a spectral width of at least approximately 1.2 picometers.

16. An apparatus according to claim 14, wherein the processing structure determines a first wavelength in the first spectral profile such that spectral energy of the first spectral profile is approximately equal on each side of the first wavelength, determines a second wavelength in the second spectral profile such that spectral energy of the second spectral profile is approximately equal on each side of the second wavelength, and determines the spectral offset by determining an offset between the wavelengths.

17. An apparatus according to claim 14, including a lithography tool including the workpiece support, beam directing structure, and support adjusting structure.

18. An apparatus according to claim 14,
wherein the spectrum measuring structure measures the spectrum of the first beam during an exposure of the first exposure field and measures the spectrum of the second beam during an exposure of the second exposure field; and
wherein the support adjusting structure adjusts the workpiece support position after the exposure of the second exposure field but before a subsequent exposure.

19. An apparatus according to claim 14,
wherein the spectrum measuring structure measures the spectrum of a third beam during an exposure of a third exposure field subsequent to the adjustment to obtain a third spectral profile;
wherein the processing structure determines a further spectral offset between the second spectral profile and the third spectral profile, and also calculates a further adjustment amount based on the further spectral difference and the longitudinal aberration; and
wherein the support adjusting structure adjusts the position of the workpiece support along the optical axis by the further adjustment amount.

20. An apparatus according to claim 14, wherein the spectrum measuring structure includes a spectrometer and a beam splitter positioned along the optical axis to divert portions of the first and second beams to the spectrometer.

\* \* \* \* \*